United States Patent [19]

Imamura

[11] Patent Number: 5,219,293
[45] Date of Patent: Jun. 15, 1993

[54] CONNECTION STRUCTURE OF CIRCUIT BOARDS HAVING ELECTRONIC PARTS THEREON AND FLEXIBLE CABLE FOR COUPLING THE CIRCUIT BOARDS AND CONNECTION METHOD USING THE SAME

[75] Inventor: Masaya Imamura, Kyoto, Japan
[73] Assignee: Rohm Co., Ltd., Kyoto, Japan
[21] Appl. No.: 906,421
[22] Filed: Jun. 30, 1992

[30] Foreign Application Priority Data

Jul. 3, 1991 [JP] Japan .................................. 3-162985

[51] Int. Cl.$^5$ .............................................. H01R 9/09
[52] U.S. Cl. ...................................... 439/67; 439/66; 439/77; 439/493
[58] Field of Search .................. 439/66, 67, 74, 77, 439/82, 493, 591

[56] References Cited

U.S. PATENT DOCUMENTS

| | | | |
|---|---|---|---|
| 4,221,444 | 9/1980 | Patrick | 439/66 |
| 4,695,258 | 9/1987 | Hanson et al. | 439/67 |
| 4,850,883 | 7/1989 | Kabadi | 439/67 |
| 4,913,656 | 4/1990 | Gordon et al. | 439/67 |
| 5,009,605 | 4/1991 | Crumly et al. | 439/67 |

FOREIGN PATENT DOCUMENTS 2-22890 1/1990 Japan.
0089388 3/1990 Japan .................................. 439/67

*Primary Examiner*—Paula A. Bradley
*Attorney, Agent, or Firm*—Oliff & Berridge

[57] ABSTRACT

A connection structure and method of circuit boards including electronic parts thereon and a flexible cable for coupling the circuit boards. A first circuit board mounting electronic parts such as light detector elements and the like in an image sensor and a conductive pattern for connecting an image signal of the light detector elements to an external circuit and a second circuit board including amplifying ICs and a conductive pattern connected thereto are mutually laminated. The first circuit board is formed with a slot and a flexible bridging conductor is inserted into the slot. The flexible cable having a conductive pattern at its end is laminated on the laminated circuit boards so as to correspond to the conductive patterns. The flexible cable and the laminated circuit boards are closely fixed by a fixing plate to perform an electrical connection between the electronic parts of the circuit boards and between the electronic parts and the flexible cable at the same time without using soldering.

7 Claims, 8 Drawing Sheets

CONNECTION STRUCTURE OF CIRCUIT BOARDS HAVING ELECTRONIC PARTS THEREON AND FLEXIBLE CABLE FOR COUPLING THE CIRCUIT BOARDS AND CONNECTION METHOD USING THE SAME

BACKGROUND OF THE INVENTION i) Field of the Invention

The present invention relates to a connection structure of circuit boards having electronic parts thereon such as a thermal printer head, a head board in an image sensor or the like and a flexible cable for coupling the circuit boards, and more particularly to a connection structure of at least two circuit boards having various electronic parts mounted on their surfaces and various wiring circuits formed thereon and a flexible cable haivng a belt form for electrically coupling the circuit boards and a connection method using the same.

ii) Description of the Related Arts

Conventionally, in one case, in order to electrically connect wiring circuits formed on at least two circuit boards, a connector is attached to the wiring circuit of each circuit board by soldering, and the connectors of the two circuit boards are mutually connected. In another case, lead terminals are connected to the wiring circuit of one circuit board by soldering, and the ends of the lead terminals are connected to the wiring circuit of another circuit board by soldering. In still another case, the wiring circuits of the two circuit boards are directly connected to each other by soldering.

Further, in general, two circuit boards are electrically connected to each other by using a flexible cable. In this case, the connectors are attached to the wiring circuits of the circuit boards by soldering, and connectors attached to both ends of the flexible cable are inserted into the connectors of the circuit boards. In another case, a direct connection of the flexible cable with the wiring circuits of the circuit boards soldering is also generally carried out.

However, usually, in order to electrically connect at least two circuit boards by using a flexible cable, a connector should be attached to each circuit board. Hence, much time and labor are required for the connection of the connectors with the circuit boards. Thus, not only is the cost for carrying out the connection largely raised but also the connection parts themselves are extremely costly.

Also, all the above-described connection means require soldering, and an improper thermal influence is given to the various electronic parts mounted on the surfaces of the circuit boards. Further, droplets or splashes of solder and flux can be attached to the various electronic parts and the various wiring circuits.

Conventionally, for example, an improved connection structure for coupling circuit boards by a flexible cable without using soldering has been proposed, as disclosed in Japanese Patent Laid-Open No. Hei 2-22890.

In this connection structure, the flexible cable positioned and held on the circuit boards is crimped onto the circuit boards by using silicone rubber or the like, and thus the electrical connection between the circuits of the circuit boards can be exactly performed without using soldering.

Therefore, in this connection structure without using soldering, even when an electric circuit connection part, an exothermic resistor part and a light emitter or a light detector are present in close proximity to one another on the circuit boards as in a thermal printer head board or an image sensor, the improper thermal influence exerted by the soldering operation and the droplets or splashes of solder or flux will not be given to the exothermic resistor part, the light emitter or the light detector.

However, in this conventional structure, when two circuit boards are arranged in a laminated fashion, an exact electrical connection between the two circuit boards in a simple structure can not be performed.

Conventionally, this two-layer laminate circuit board unit is often used for containing complicated wiring patterns and electronic parts within a limited area. For instance, within an image sensor board or the like, since an array of a plurality of light detector elements and amplifying elements can not be coexistent within the same flat surface, these elements are mounted on two boards in a separate structure. That is, the light detector element array is arranged on a first board on the surface side, and the amplifying elements are mounted on a second board on the reverse side. In order to perform an electrical connection of these separated two boards, the two boards are usually laminated and are electrically connected with each other by using one of the several above-described methods.

Accordingly, in such a stacked two-layer circuit board unit, in particular, the connection parts are enlarged. Further, for the electrical connection of the two boards by using one flexible cable, the aforementioned crimp structure using the silicone rubber can not be used.

SUMMARY OF THE INVENTION

It is therefore an object of the present invention to provide an improved connection structure and connection method in view of the aforementioned problems of the prior art, which are capable of performing an electrical connection of a plurality of circuit boards laminated by using a flexible cable and connecting electronic parts mounted on the circuit boards at the same time in a simple structure without using soldering.

It is another object of the present invention to provide an improved connection structure and connection method in view of the aforementioned problems of the prior art, which are capable of determining a lamination number of a plurality of circuit boards at will and performing an electrical connection of the laminated circuit boards by using a flexible cable in an easy and simple manner.

In accordance with one aspect of the present invention, there is provided a connection structure of circuit boards and a flexible cable for coupling the circuit boards, comprising:

(A) at least two upper and lower circuit boards to be laminated, each circuit board including electronic parts thereon and an electrode pattern connected to the electronic parts;

(B) a flexible cable to be overlaid on the laminated circuit boards at one end, the flexible cable having an electrode pattern corresponding to the electrode pattern of the circuit boards;

(C) a fixing plate for fixing the laminated circuit boards and the flexible cable overlaid thereon at the same time;

(D) a slot formed in the upper circuit board put between the flexible cable and the lower circuit board; and (E) a flexible bridging conductor to be inserted into the slot for electrically connecting the electrode patterns of the flexible cable and the lower circuit board.

In accordance with another aspect of the present invention, there is provided a connection method of circuit boards and a flexible cable for coupling the circuit boards, comprising the step of:

(A) laminating at least two upper and lower circuit boards, each circuit board including electronic parts thereon and an electrode pattern connected to the electronic parts;

(B) inserting a flexible bridging conductor into a slot formed in the upper circuit board;

(C) laminating a flexible cable on the laminated circuit boards at one end so as to allow an electrode pattern of the flexible cable to correspond to the electrode pattern of the circuit boards; and (D) closely fixing the laminated circuit boards and the flexible cable by a fixing plate.

In the connection structure, the fixing plate includes a clamping plate having fixing legs and each fixing leg is long enough for securely crimping the laminated circuit boards and the flexible cable and is formed with a compressible retaining clip at its tip.

The flexible bridging conductor can include a resilient body and either a plurality of lead wires or conductors wound around the resilient body at almost the same pitch as the electrode pattern of either the flexible cable or the circuit boards.

The connection structure can further include a spacer between the circuit boards and electronic parts are mounted between the circuit boards.

The flexible cable includes positioning grooves and the fixing legs of the fixing plate are engaged with the positioning grooves of the flexible cable to perform an exact positioning of the flexible cable.

According to the present invention, a connection between electronic parts mounted on laminated circuit boards or a connection between the electronic parts and external circuits can be performed by a single flexible cable without using soldering, and the influences of the heat generated by the soldering operation and droplets or splashes of solder and flux are not given to the electronic parts such as light detector elements of an image sensor or exothermic resistors or the like of a thermal printer head.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1:
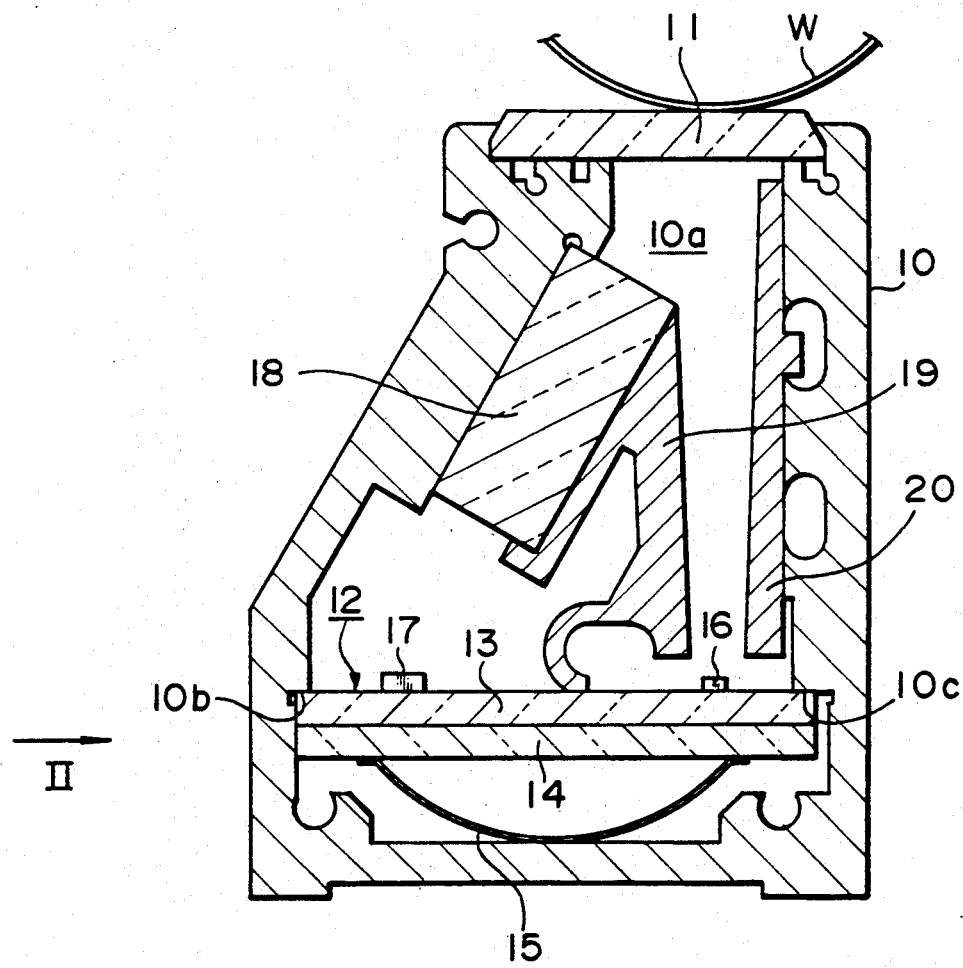
FIG. 1 is a longitudinal cross sectional view of an image sensor including a first embodiment of a connection structure of a laminated circuit board unit and a flexible cable for coupling circuit boards according to the present invention.

Referring now to the drawings, wherein like reference characters designate like or corresponding parts throughout the views and thus the repeated description thereof can be omitted for brevity, there is shown in FIG. 1 an image sensor including the first embodiment of a connection structure of a laminated circuit board unit and a flexible cable for coupling circuit boards according to the present invention.

As shown in FIG. 1, a known frame 10 has a cross section having a pentagon and constitutes a line image sensor frame extending perpendicular to the paper surface of FIG. 1. In this embodiment, the frame 10 is made of aluminum. A transparent glass cover 11 is mounted on the upper opening part of the frame 10. The image sensor is pushed onto a document W at the transparent glass cover 11, and a sensor light is irradiated to the document W so as to electrically read an image drawn on the document W, from the light reflected therefrom.

In an internal chamber 10a of the frame 10, a laminated circuit board unit 12 is formed by laminating a first circuit board 13 and a second circuit board 14. The laminated circuit board unit 12 is positioned at both ends by holding parts 10b and 10c provided on the internal surface of the frame 10, and the position of the laminated circuit board unit 12 is securely fixed by bent springs 15 having a biased state, inserted between the bottom of the frame 10 and the second circuit board 14. In this case, by providing only two bent springs 15 at both ends of the laminated circuit board unit 12 elongating perpendicular to the paper surface of FIG. 1, it is sufficient to perform the holding function of the laminated circuit board unit 12 within the frame 10.

On the first circuit board 13, light emitting elements 16 such as LED chips or the like are aligned, and a line of light is emitted from the light emitting elements 16 to the contact part of the document W through the transparent glass cover 11.

Further, on the first circuit board 13, light detector elements 17 such as photo diode chips or the like are aligned at a reading pitch of the image sensor, and the light reflected by the document W, that is, the image of the document W as the reflected light, is incident to the light detector elements 17 through a rod lens array 18 for condensing the light, arranged in the internal chamber 10a of the frame 10. In this embodiment, a plurality of rod lens arrays 18 are securely arranged within the internal chamber 10a by a lens holder 19 so as to align perpendicular to the paper surface of FIG. 1 without any space at a slant angle with respect to the flat surface of the transparent glass cover 11. A reflector plate 20 for effectively leading the light emitted by the light emitting elements 16 to the document W is mounted to the internal wall of the internal chamber 10a of the frame 10, if necessary.

As described above, in the image sensor, the light emitting elements 16 are aligned along the reading direction almost without any space and the light detector elements 17 for detecting the light reflected by the document W to convert to electric signals at a predetermined reading pitch are also aligned almost without any space. On the first circuit board 13, these electronic parts are mounted and an electric circuit connection is carried out from pattern printed electrodes to the electronic parts such as the light emitting elements 16 and the light detector elements 17. Hence, in order to miniaturize the image sensor, other electronic parts except these electronic parts, such as amplifying ICs and the like are mounted on the second circuit board 14, and the first and second circuit boards 13 and 14 are laminated. However, in this laminated circuit board unit 12, the electronic parts mounted on the first and second circuit boards 13 and 14 are to be electrically connected. According to the present invention, by using one flexible cable, the electrical connection of the cable terminals and the electronic parts mounted on the first and second circuit boards 13 and 14 and the connection between the electronic parts mounted on the first and second circuit boards 13 and 14 are performed as hereinafter described in detail.

In FIGS. 2 to 6, there is shown the first embodiment of the laminated circuit board unit 12 shown in FIG. 1.

Figure 2:
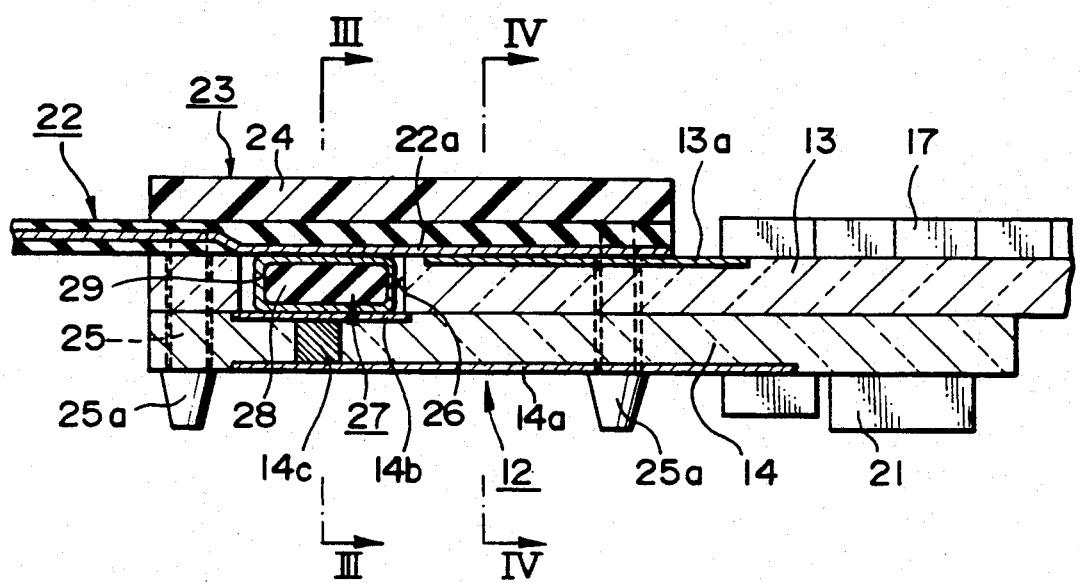
FIG. 2 is an end view, partly in section, of the laminated circuit board unit, seen from an arrow II shown in FIG. 1.

FIG. 2 is an end view, partly in section, of the laminated circuit board unit 12 taken out of the frame 10, seen from an arrow II shown in FIG. 1, and the first circuit board 13 and the second circuit board 14 are tightly contacted with each other. The light detector elements 17 are mounted on the first circuit board 13, and an electronic part 21 such as an amplifying IC or the like is mounted on the second circuit board 14. The first and second circuit boards 13 and 14 are composed of a ceramic or a glass-epoxy resin, and the desired circuit patterns 13a and 14a are formed on their respective upper and lower surfaces and are electrically connected to the necessary electronic parts 17 and 21, respectively. Also, an electrode pattern 14b is formed on the upper surface of the second circuit board 14, and the desirable connection state of the patterns 14b and 14a formed on the upper and lower surfaces is achieved by a lead terminal 14c of a through-hole passing through the second circuit board 14.

Figure 6:
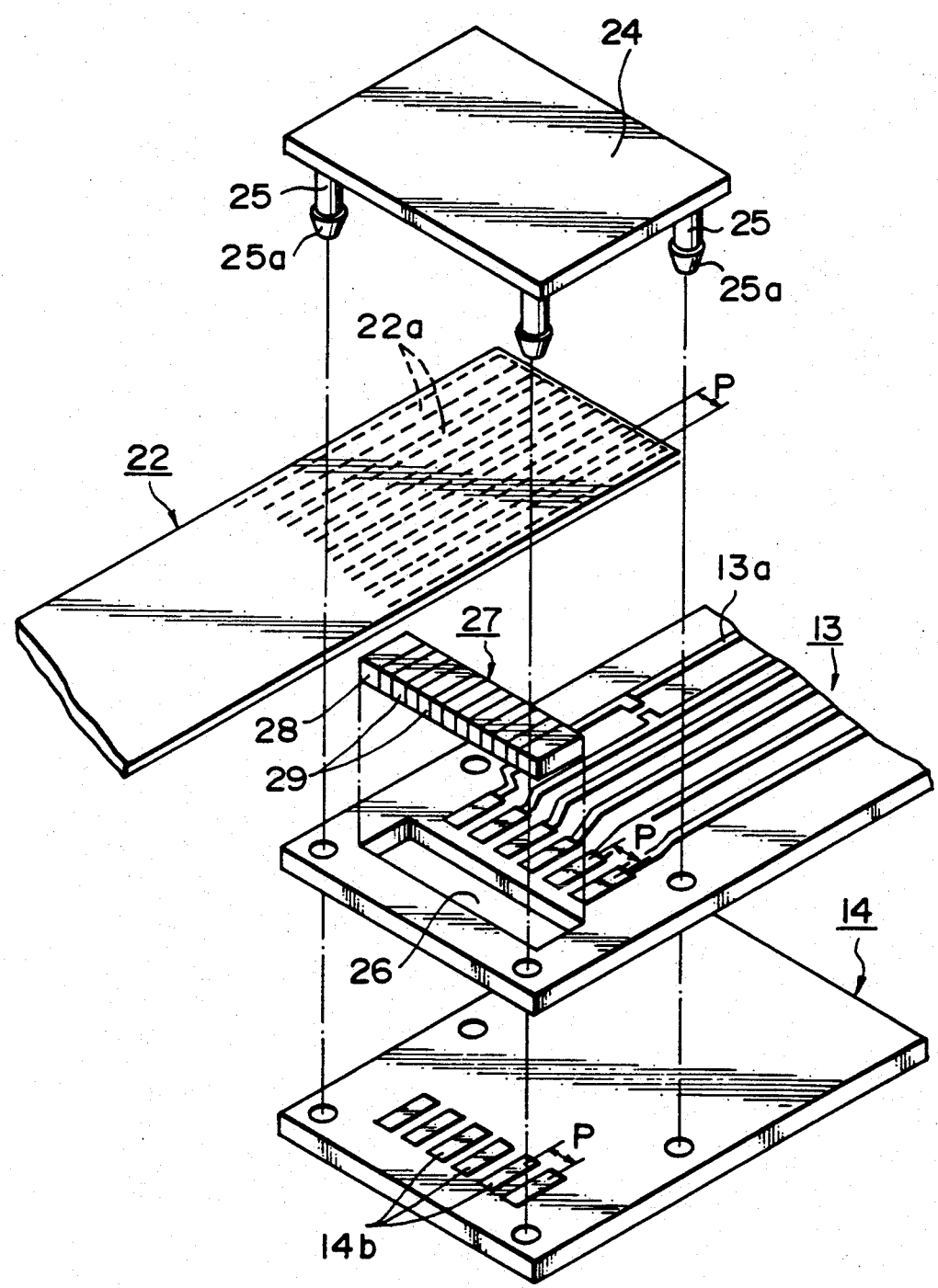
FIG. 6 is an exploded perspective view of the laminated circuit board unit shown in FIG. 1.

As is apparent from FIG. 6, the electrode patterns 13a, 14b and 14a are formed at a pitch P of constant interval, and an electrode pattern formed on a flexible cable 22 hereinafter described also possesses the pitch P in the same manner. Hence, according to the present invention, by using a single flexible cable, the electric connection between the cable and each circuit board and between the electronic parts mounted on the circuit boards can be performed at the same time.

An electric pattern 22a of the flexible cable 22 is exposed on the underside of its end part so as to electrically connect with the electrode patterns 13a and 14b, as clearly shown in FIG. 2.

In this embodiment, in order to closely fix the flexible cable to the laminated circuit board unit 12, a fixing plate 23 is used, and the fixing plate 23 includes a clamping plate 24 having approximately a rectangular form and four fixing legs 25 projecting to one side from the clamping plate 24. Each fixing leg 25 is formed with a compressible retaining clip 25a at its tip. Therefore, while the flexible cable 22, the first circuit board 13 and the second circuit board 14 are laminated, the four fixing legs 25 of the fixing plate 23 are penetrated through the through-holes formed in the first and second circuit boards 13 and 14, and the compressible retaining clips 25a of the four fixing legs 25 are projected from the bottom of the second circuit board 14. As a result, the first and second circuit boards 13 and 14 and the flexible cable 22 can be extremely readily positioned and fixed to the predetermined positions.

Figure 3:
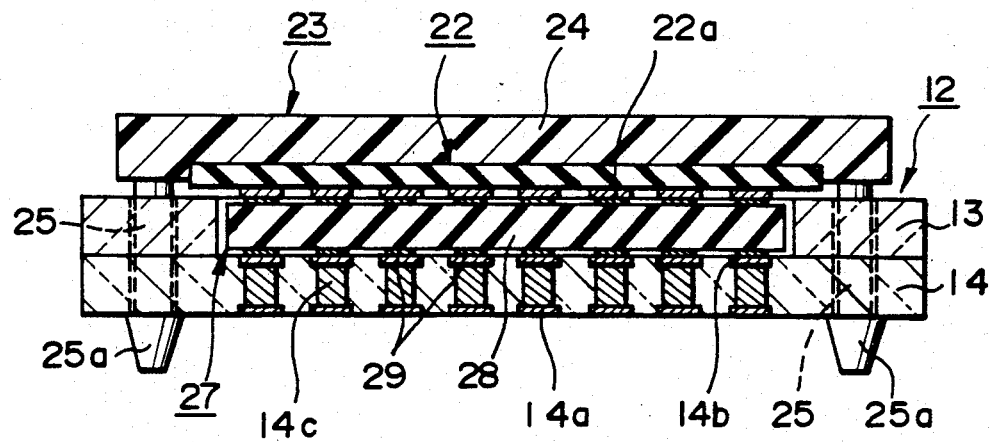
FIG. 3 is a cross sectional view, taken along the line III—III shown in FIG. 2.
Figure 4:
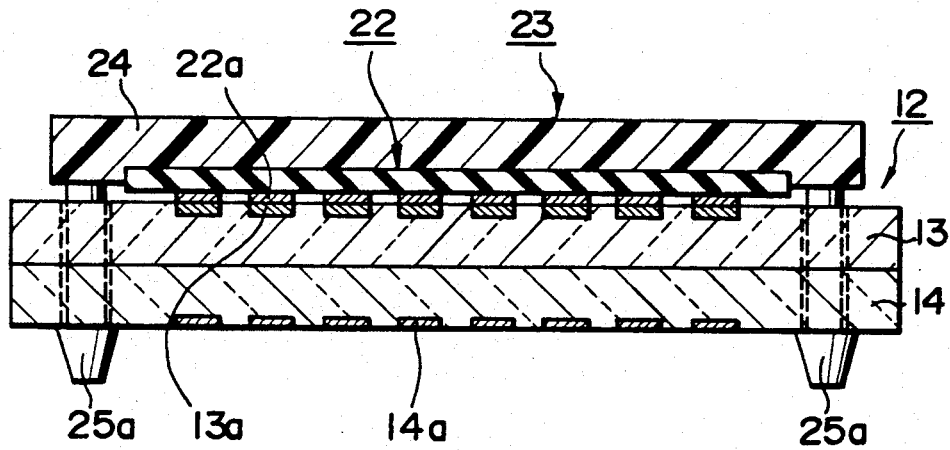
FIG. 4 is a cross sectional view, taken along the line IV—IV shown in FIG. 2.
Figure 5:
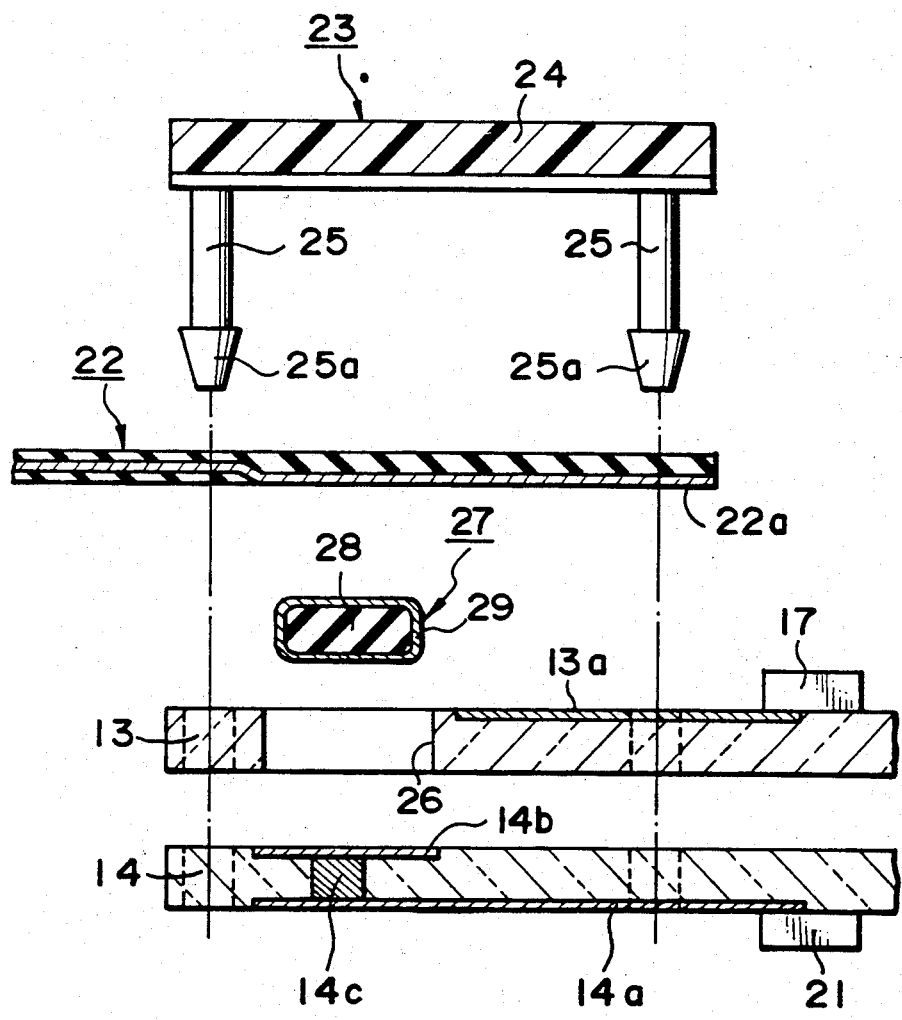
FIG. 5 is an exploded sectional view of the laminated circuit board unit shown in FIG. 1.

In this embodiment, the first circuit board 13 is provided with a slot 26 in an exposure position of the electrode pattern 14b of the second circuit board 14 while the first and second circuit boards 13 and 14 are laminated to form the laminated circuit board unit 12. A flexible bridging conductor 27 is inserted into the slot 26 of the first circuit board 13. This flexible bridging conductor 27 has a structure composed of a resilient body and a plurality of lead wires separately wound around the resilient body in a non-conducting condition, that is, more specifically, as shown in FIG. 3, a plurality of lead wire or conductor rings 29 are wound around a resilient body 28 at the same pitch as the pitch P of the above-described electrodes. Hence, while the flexible bridging conductor 27 is inserted into the slot 26 of the first circuit board 13, when the laminated circuit board unit 12 and the flexible cable 22 are tightly fixed by board unit 12 and the flexible cable 22 are tightly fixed by the fixing plate 23, the flexible bridging conductor 27 is pressed into the slot 26 and thus the electrode pattern 22a of the flexible cable 22 can be connected to the electrode pattern 14b of the second circuit board 14 via the conductor rings 29 of the flexible bridging conductor 27. In this embodiment, the length of the four fixing legs 25 of the fixing plate 23 is properly determined so that the first and second circuit boards 13 and 14 can be exactly and closely contacted and held and the electrode pattern 22a of the flexible cable 22 and the electrode pattern 13a of the first circuit board 13 can be contacted with each other with a sufficient clampling force.

Further, the electrode pattern 22a of the flexible cable 22 and the upper electrode pattern 14b of the second circuit board 14 can be closely contacted with the conductor rings 29 of the flexible bridging conductor 27 with a proper clamping force due to the resilient function of the resilient body 28, made of rubber or the like, of the flexible bridging conductor 27. Accordingly, the desired image signal output from the light detector elements 17 mounted on the first circuit board 13 can be transmitted to an external device from the electrode pattern 13a of the first circuit board 13 via the electrode pattern 22a of the flexible cable 22. Further, the signal output from the electronic part 21 mounted on the second circuit board 14 can be sent to an external circuit via the electrode pattern 14a, the through-hole lead terminal 14c, the upper electrode pattern 14b, the conductor rings 29 and the electrode pattern 22a of the flexible cable 22. Also, in this embodiment, the light detector elements 17 of the first circuit board 13 and the electronic part 21 of the second circuit board 14 can be connected via the electrode pattern 13a, the electrode pattern 22a, the conductor rings 29, the electrode pattern 14b, the through-hole lead terminal 14c and the electrode pattern 14a.

Of course, according to the present invention, these electrical connection paths can be freely selected, and thus the signal can be supplied from the outside to the electronic parts 17 and 21 of the first and second circuit boards 13 and 14 by other electrode patterns. These depend on the pattern design of the electrode patterns 13a, 14a, 14b and 22a.

As described above, in this embodiment, by using the single flexible cable 22, a good electric connection to the laminated circuit board unit 12 via the flexible bridging conductor by a simple clamping and fixing operation can be readily obtained.

Also, in this embodiment, although the flexible bridging conductor 27 can be formed by winding the lead wires or the conductors around the resilient body 28, anisotropic conductive rubber capable of flowing a current only in a certain direction can be used for the flexible bridging conductor 27.

Further, although the fixing plate 23 semipermanently connects the flexible cable 22 and the laminated circuit board unit 12 by the compressible retaining clips 25a of the four fixing legs 25, a removable proper fixing means such as clamping and fixing by a screw or a plate spring can be used in place of the fixing plate 23.

Therefore, according to the present invention, a connection between electronic parts mounted on a laminated circuit board unit or a connection between the electronic parts and external circuits can be performed by a single flexible cable without using soldering, and in particular, extremely high quality and stability can be given to light detector elements of an image sensor or exothermic resistor parts or the like of a thermal printer head which can be damaged by heat during soldering and splashes of solder and flux.

Figure 7:
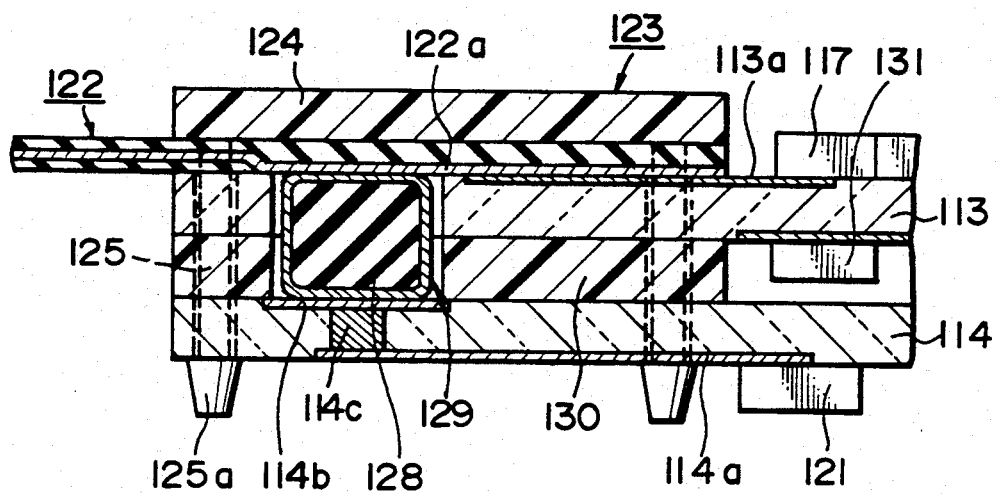
FIG. 7 is an elevational view, partly in section, of a second embodiment of a connection structure of a laminated circuit board unit and a flexible cable for coupling circuit boards according to the present invention.

In FIG. 7, there is shown the second embodiment of a connection structure of a laminated circuit board unit and a flexible cable for coupling circuit boards according to the present invention. In this embodiment, corresponding parts to those of the above-described first embodiment are designated by numerals added to 100 and thus the detailed description thereof can be omitted for brevity. In this instance, a spacer 130 is inserted between first and second circuit boards 113 and 114, and thus other electronic parts can be mounted on any one of the back surfaces of the first and second circuit boards 113 and 114. In FIG. 7, these electronic parts are indicated by a numeral 131. This embodiment is suitable for a laminated circuit board unit on which a large number of electronic parts are mounted within a small area.

Figure 8:
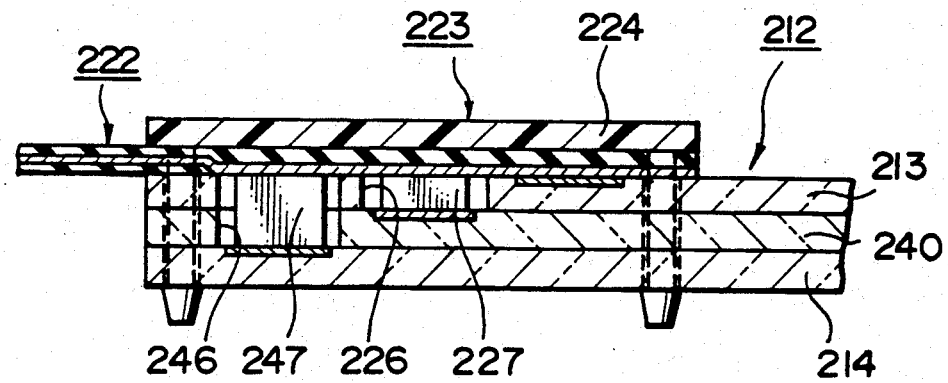
FIG. 8 is an elevational view, partly in section, of a third embodiment of a connection structure of a three-layer laminated circuit board unit and a flexible cable for coupling circuit boards according to the present invention.

In FIG. 8, there is shown the third embodiment of a connection structure of a laminated circuit board unit and a flexible cable for coupling circuit boards according to the present invention. In this embodiment, corresponding parts to those of the above-described first embodiment are designated by numerals added to 200 and thus the detailed description thereof can be omitted for brevity. In this case, a three-layer laminated circuit board unit is formed by inserting a third circuit board 240 between first and second circuit boards 213 and 214. In this embodiment, a circuit pattern formed on the third circuit board 240 can be further effectively used. Further, in this case, by providing the space between the adjacent two circuit boards by a spacer or spacers, electronic parts can be further mounted in the space.

In this embodiment, the first and third circuit boards 213 and 240 are formed with slots 226 and 246 in different positions, and flexible bridging conductors 227 and 247 having different thicknesses are inserted into the slots 226 and 246, respectively.

Of course, according to the present invention, the number of laminations of the circuit boards can be freely determined.

Figure 9:
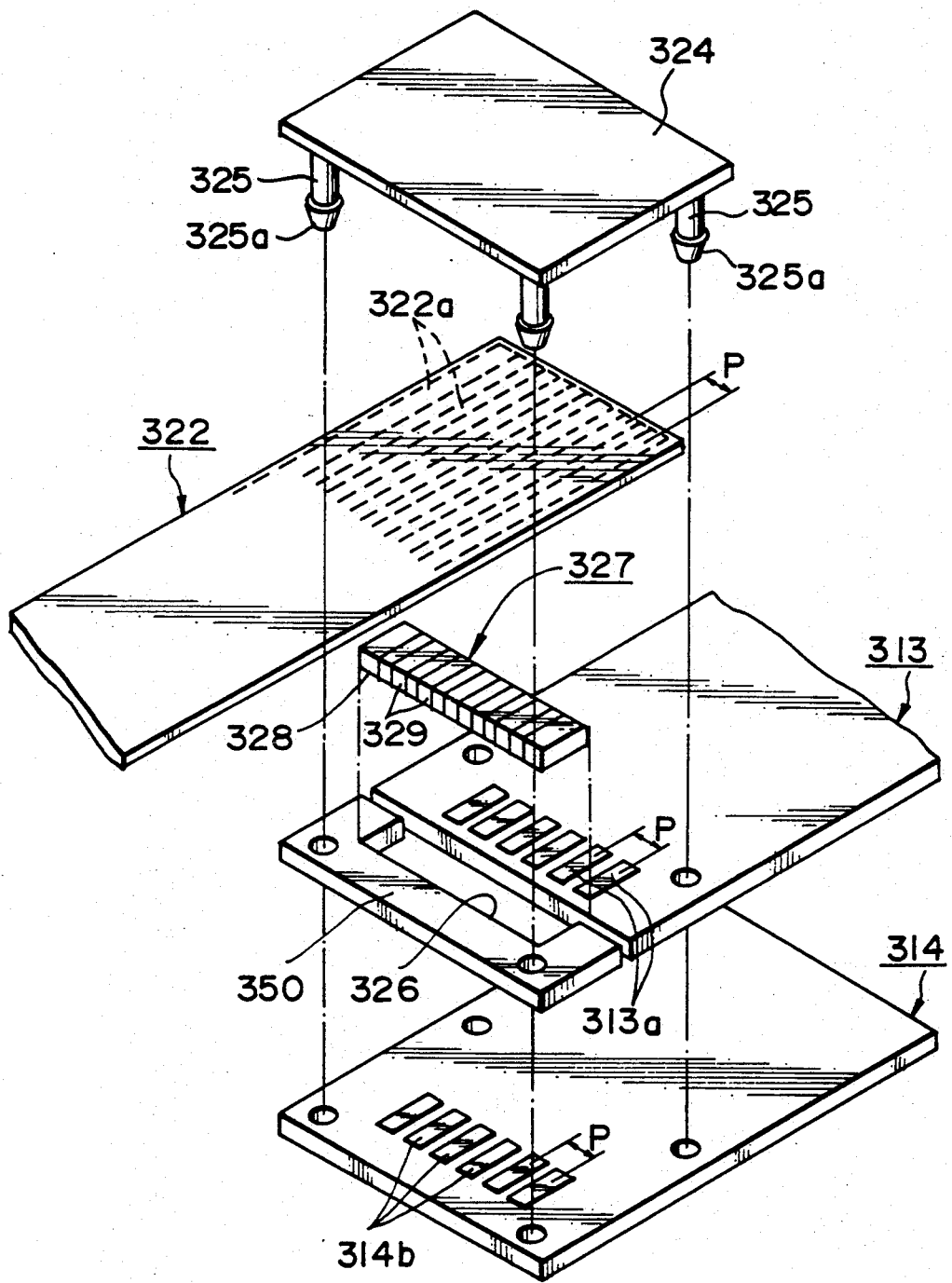
FIG. 9 is an exploded perspective view of a fourth embodiment of a connection structure of a laminated circuit board unit and a flexible cable for coupling circuit boards according to the present invention.

In FIG. 9, there is shown the fourth embodiment of a connection structure of a laminated circuit board unit and a flexible cable for coupling circuit boards according to the present invention. In this embodiment, corresponding parts to those of the above-described first embodiment are designated by numerals added to 300 and thus the detailed description thereof can be omitted for brevity. In this case, a first circuit board 313 is provided with no slot, and a slot 326 is formed by a combination of one end part of the first circuit board 313 and a C-shaped guide plate 350 having the same thickness as the first circuit board 313. In this connection structure, the first circuit board 313 can be further simplified.

Figure 10:
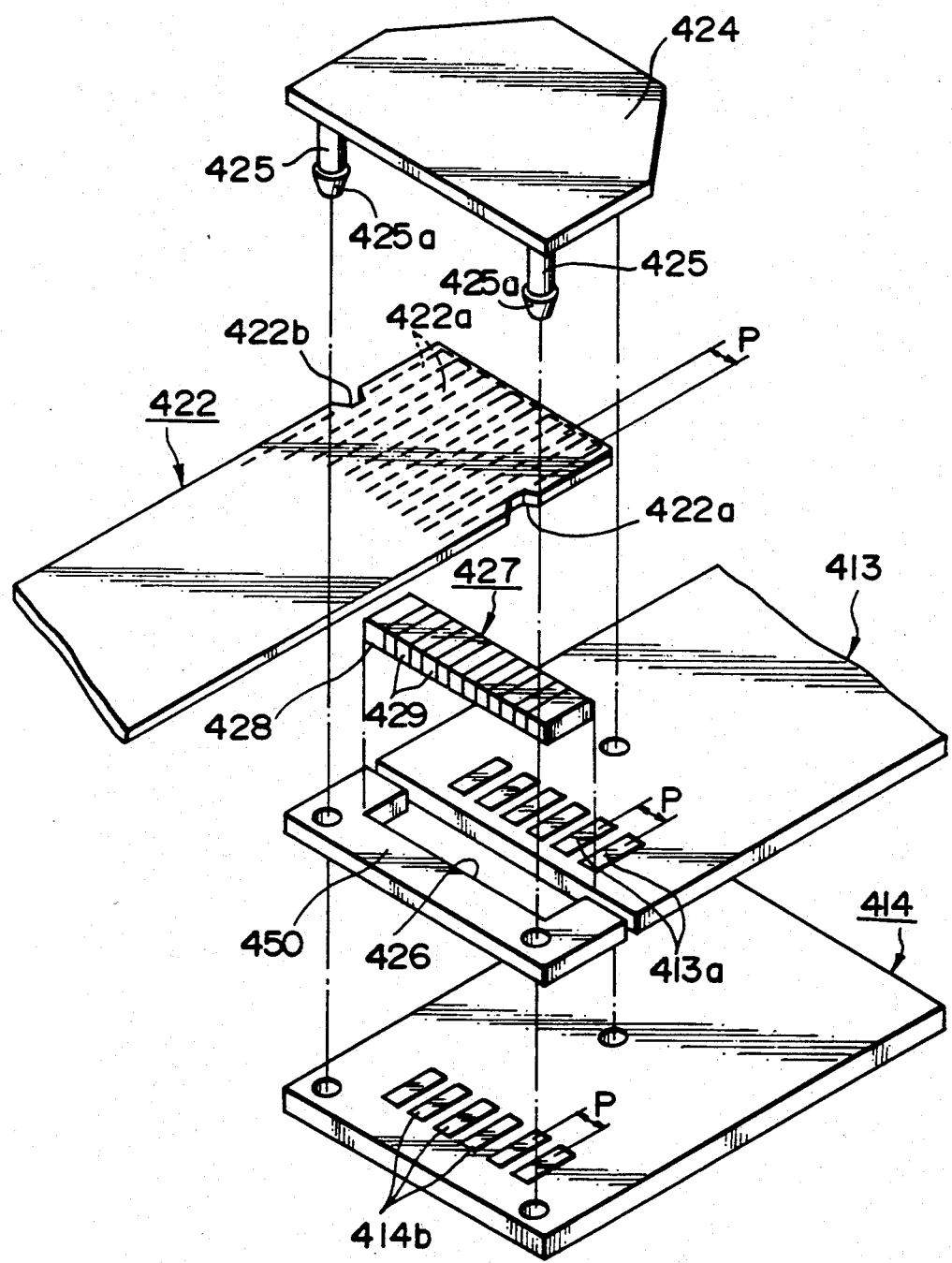
FIG. 10 is an exploded perspective view of a fifth embodiment of a connection structure of a laminated circuit board unit and a flexible cable for coupling circuit boards according to the present invention.

In FIG. 10, there is shown the fifth embodiment of a connection structure of a laminated circuit board unit and a flexible cable for coupling circuit boards according to the present invention. In this embodiment, corresponding parts to those of the above-described first embodiment are designated by numerals added to 400 and thus the detailed description thereof can be omitted for brevity. In this instance, a fixing plate 423 includes three fixing legs 425, two of which are engaged with positioning grooves 422a and 422b formed on both sides of a flexible cable 422 so as to securely fix and hold the flexible cable 422.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A connection structure of circuit boards and a flexible cable for coupling the circuit boards, comprising:
    at least two upper and lower circuit boards to be laminated, each circuit board including electronic parts thereon and an electrode pattern connected to the electronic parts;
    a flexible cable to be overlaid on the laminated circuit boards at one end, the flexible cable having an electrode pattern corresponding to the electrode pattern of the circuit boards;
    a fixing plate for fixing the laminated circuit boards and the flexible cable overlaid thereon at the same time;
    a slot formed in the upper circuit board put between the flexible cable and the lower circuit board; and
    a flexible bridging conductor to be inserted into the slot for electrically connecting the electrode patterns of the flexible cable and the lower circuit board.

2. The connection structure of claim 1, wherein the fixing plate comprises a clamping plate having fixing legs and each fixing leg has sufficient length to securely clamp the laminated circuit boards and the flexible cable and is formed with a compressible retaining clip at its tip.

3. The connection structure of claim 1, wherein the flexible bridging conductor includes a resilient body and either a plurality of lead wires or conductors wound around the resilient body at almost the same pitch as the electrode pattern of either the flexible cable or the circuit boards.

4. The connection structure of claim 1, further comprising a spacer between the circuit boards and electronic parts are mounted between the circuit boards.

5. The connection structure of claim 1, wherein the flexible cable includes positioning grooves and the fixing legs of the fixing plate are engaged with the positioning grooves of the flexible cable to perform an exact positioning of the flexible cable.

6. An image sensor including a connection structure of circuit boards and a flexible cable for coupling the circuit boards, comprising:
   at least two upper and lower circuit boards to be laminated, each circuit board including electronic parts thereon and an electrode pattern connected to the electronic parts;
   a flexible cable to be overlaid on the laminated circuit boards at one end, the flexible cable having an electrode pattern corresponding to the electrode pattern of the circuit boards;
   a fixing plate for fixing the laminated circuit boards and the flexible cable overlaid thereon at the same time;
   a slot formed in the upper circuit board put between the flexible cable and the lower circuit board; and
   a flexible bridging conductor to be inserted into the slot for electrically connecting the electrode patterns of the flexible cable and the lower circuit board.

7. A connection method of circuit boards and a flexible cable for coupling the circuit boards, comprising the step of:
   laminating at least two upper and lower circuit boards, each circuit board including electronic parts thereon and an electrode pattern connected to the electronic parts;
   inserting a flexible bridging conductor into a slot formed in the upper circuit board;
   laminating a flexible cable on the laminated circuit boards at one end so as to allow an electrode pattern of the flexible cable to correspond to the electrode pattern of the circuit boards; and
   closely fixing the laminated circuit boards and the flexible cable by a fixing plate.

* * * * *